United States Patent [19]
Mirley, Jr. et al.

[11] Patent Number: 4,622,740
[45] Date of Patent: * Nov. 18, 1986

[54] ELECTRICAL COMPONENT LEAD SENSOR

[75] Inventors: William H. Mirley, Jr., Reading; Richard B. Maxner, Danvers, both of Mass.

[73] Assignee: USM Corporation, Farmington, Conn.

[ * ] Notice: The portion of the term of this patent subsequent to Feb. 19, 2002 has been disclaimed.

[21] Appl. No.: 553,774

[22] Filed: Nov. 21, 1983

[51] Int. Cl.⁴ ............................................. H05K 13/04
[52] U.S. Cl. ........................................ 29/715; 29/705; 29/741
[58] Field of Search ................... 29/564.8, 715, 741, 29/566.3, 705, 721, 566, 33 M; 140/93 D, 105; 227/2, 79, 155

[56] References Cited

U.S. PATENT DOCUMENTS

| | | | |
|---|---|---|---|
| 3,611,544 | 10/1971 | Frels et al. | 29/741 X |
| 4,058,881 | 11/1977 | Gavin et al. | 29/715 |
| 4,218,817 | 8/1980 | Takano | 29/715 X |
| 4,286,379 | 9/1981 | Kawa et al. | 29/705 |
| 4,499,649 | 2/1985 | Maxner | 29/564.8 X |

OTHER PUBLICATIONS

IBM Technical Disclosure Bulletin, vol. 26, No. 7B, Lorenzo et al., 12-1983.

*Primary Examiner*—Gil Weidenfeld
*Assistant Examiner*—Glenn L. Webb
*Attorney, Agent, or Firm*—Alan N. McCartney

[57] ABSTRACT

A mechanism for sensing whether the leads of a dual-in-line electrical component are in their proper position projecting through the appropriate openings in a printed circuit board. The sensor uses fiber optics to indicate whether the leads are properly positioned by using light reflected from the lead to activate a photo transducer which indicates to the computer controlling the machine operation whether the leads are properly positioned. The sensor fiber optics has light emitting and light receiving filaments operative parallel to the board surface so that the sensor only responds to the presence or absence of a component lead.

3 Claims, 3 Drawing Figures

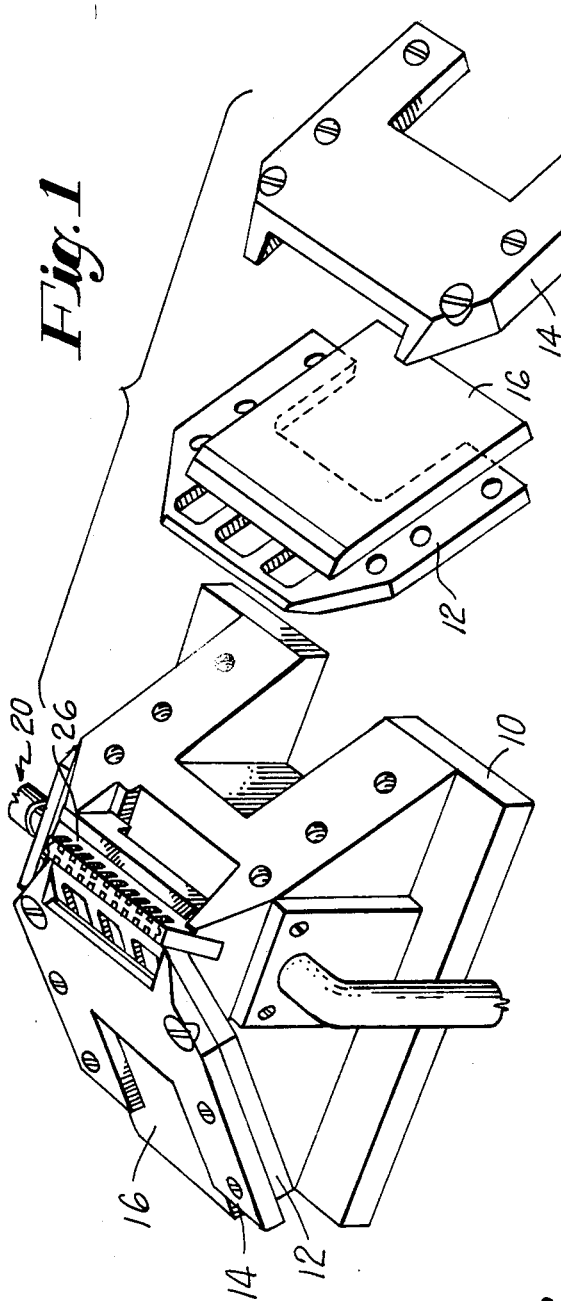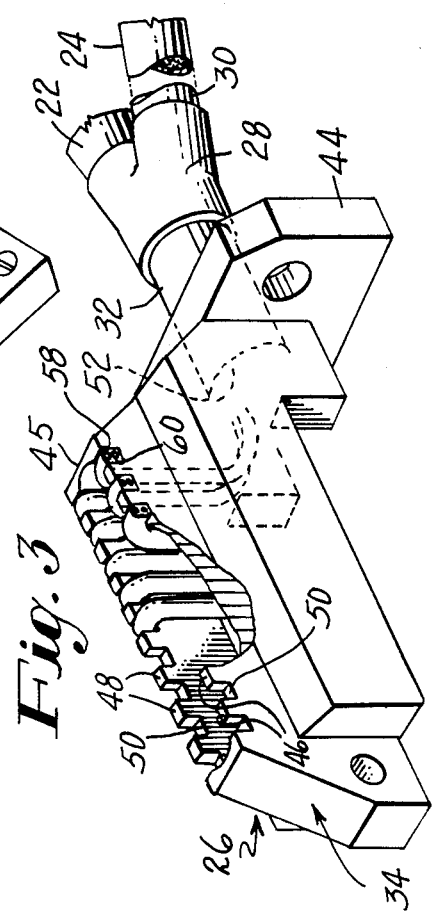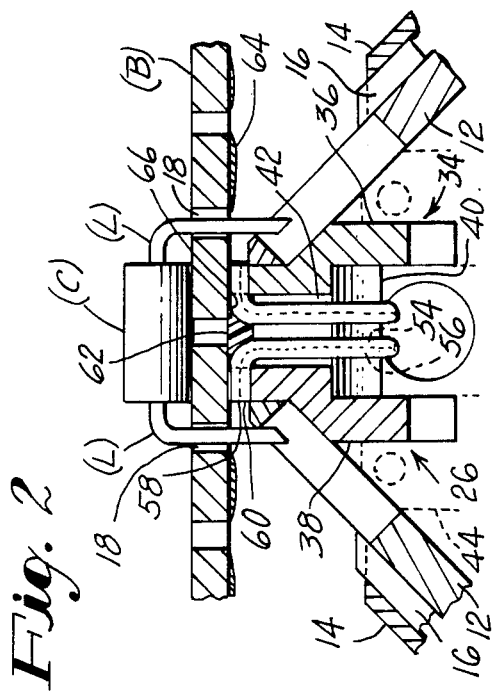

ELECTRICAL COMPONENT LEAD SENSOR

BACKGROUND OF THE INVENTION

(1) Field of the Invention

This invention relates to a mechanism to determine that the leads of an electrical component are properly inserted in the openings in a printed circuit board.

(2) Summary of the Prior Art

Printed circuit boards are extensively used in the electronics industry and are usually provided with preformed openings or holes into which the leads of an electrical component are inserted. These electrical components are inserted into the boards by automatic equipment which is programmed to rapidly place the components into the proper holes of the printed circuit board. An example of such equipment is illustrated in U.S. Pat. No. 4,063,347. After the component is inserted into the board, the leads are cut and clinched or formed so that the component is locked onto the board. An example of such a cut-clinch unit is illustrated in U.S. Pat. No. 4,292,727 and the disclosure thereof is incorporated herein by reference.

During this operation of automatically inserting components into printed circuit boards it is necessary to provide inspection and checking means at each stage of the operation to assure that the operation was performed properly. One such inspection is to determine that the leads of a dual-in-line component are properly placed down through the openings in the board.

BRIEF SUMMARY OF THE INVENTION

It is the object of this invention to provide a means to inspect that each lead of a dual-in-line component is properly placed down through the opening in a printed circuit board during the operation of automatically inserting a component into the board.

It is a further object of the invention to provide a sensing means in the cut and clinch mechanism of component insertion equipment that will indicate whether the leads of a dual-in-line component are properly positioned down through the openings in a printed circuit board.

It is another object of the invention to provide a fiber optics sensor to indicate that the leads of a dual-in-line component are down through their respective openings in a printed circuit board.

It is still another object of this invention to have a fiber optics sensor located in the cut-clinch mechanism with the ends of the sensor filaments extending above the blades of the cut-clinch mechanism and reflecting and receiving light for sensing purposes substantially parallel to the board surface to eliminate spurious reflections which may effect the reliability of the sensor.

BRIEF DESCRIPTION OF THE DRAWING

FIG. 1 is a perspective view of the fiber optics sensor of this invention;

FIG. 2 is an enlarged sectional view showing the lead sensor being located in the cut-clinch unit and sensing lead location in the board; and FIG. 3 is an enlarged perspective view of the filament housing which is positioned in the cut-clinch unit.

DESCRIPTION OF THE PREFERRED EMBODIMENT

In co-pending U.S. patent application Ser. No. 407,293 filed Aug. 11, 1982 there is disclosed a fiber optics lead sensor and the disclosure therein is incorporated herein by reference. In the aforementioned disclosure and the instant disclosure, a fiber optic bundle is split so that one half of the bundle comes from a common light source to pass light to a support housing located in the cut-clinch unit. The light emitted strikes the lead of the component and is reflected to the pickup filament of the other half of the fiber optic bundle. This reflected light is transferred through the pickup filament to a photo transducer which is connected to a machine computer control. The machine computer control is operative to compare the responses of the photo transducer with an expected result. The machine computer control will disable the cut-clinch unit if the comparison is not favorable. An example of such controls is illustrated in co-pending U.S. patent application Ser. No. 451,921 filed Dec. 27, 1982 and the disclosure therein is incorporated herein by reference.

In FIG. 1 there is illustrated a cut-clinch mechanism of the type illustrated in Maxner U.S. Pat. No. 4,292,727 in which the fiber optic sensor is located for purposes of illustration. There are other types of cut-clinch units, however, with which the fiber optic sensor of this invention could be utilized.

The cut-clinch unit comprises a block 10 on which fixed knives 12 are carried by a knife retainer 14 in which movable knife 16 is positioned. This cut-clinch unit is the same as illustrated in Maxner U.S. Pat. No. 4,292,727 and the disclosure of that patent is incorporated herein by reference.

The cut-clinch unit is adapted to be positioned under the electrical component (C) which has its leads (L) inserted in the openings 18 in the printed circuit board (B) as illustrated in FIG. 2.

At this stage of the assembly of the electronic components, it is desirable for the machine control to know that the leads of the component are properly positioned down through the openings in the printed circuit board. To this end, a fiber optic sensor 20 comprises a bundle of input filaments 22 passing light from a common light source 24 to a housing 26 located between the knives of the cut-clinch unit. The input filaments 22 are joined at 28 to the pickup or output filament bundle 30 so that a combined bundle 32 of input and output filaments pass into the housing 26.

The housing 26 comprises a block member 34 having sides 36 and 38 and a bottom 40 (see FIGS. 2 and 3). A central channel 42 is formed between sides 36 and 38 and receives the filament bundle 32. The housing 26 also has extensions 44 (see FIG. 3) adapted to be attached to the block 10 of the cut-clinch mechanism.

The upper edges 45 of the housing 26 have a plurality of upstanding opposed posts 46, 48 with spaces 50 therebetween which are substantially equal to the approximate center spacing of the adjacent leads of the dual-in-line component. The filament bundle 32 passes through opening 52 in housing 26 and the input and output filaments 54 and are bunched to be directed to the spaces 50 between the posts 46, 48. The ends 58, 60 of the filaments 54, 56 are retained in the spaces 50 by a cover cap 62 extending over the upper edges 45 of housing 26.

It can thus be seen that as the component leads (L) are in position, the light emitted from the end 58 of filament 54 will be reflected off the lead and picked up by the end 60 of filament 56. The light received is transmitted by the filament 56 to a photo transducer, then through an amplifier to the computer controlling the functioning of the machine (reference is made to U.S. patent application Ser. No. 451,921 filed Dec. 27, 1982 for a detailed description of the sensor control). Thus, the operation of the fiber optics sensor using the reflection of light from the leads will indicate to the computer control of the machine whether the predetermined number and configuration of the leads of the component are in place and the cut-clinch unit will then either operate to secure the component to the board or it will be deactivated by the control, if the condition of the sensor is not in accordance with the predetermined condition which has been previously established for each component within the program of the computer.

Attention is now directed to FIG. 2 which illustrates the preferential position of the ends 58, 60 of the filaments with respect to the cut-clinch unit and the printed circuit board. Because the board may have areas of light reflecting surface resulting from an etch or a track or compound build up (illustrated at 64), it is desirable to have the ends 58, 60 of the filaments parallel with the board surface. Otherwise, should a particular lead of the component not be present, light emitted at somewhat of an angle toward the board surface may strike the reflective surface on the board and be reflected and picked up by the filament end 60 giving a false reading that a component lead was in fact present. Further, as illustrated in FIG. 2, the housing 26 extends above the cut-clinch unit so that the cut-clinch unit will not present an interference with the sensors in the same manner as described above. Thus, the housing 26 is located above the cut-clinch unit with the fiber optic sensors coacting with the leads being parallel to the board surface to eliminate any spurious reflections giving a false reading that particular component leads are present when in fact they are not. Additionally, with the upper edge 45 of the housing 26 being positioned adjacent the lower surface 66 of the board, the input and output of the sensor will have maximum exposure to the leads (L) of the components (C).

I claim:

1. In an automatic component inserting machine, a sensor for indicating that leads of a component are located down through their proper opening in the printed circuit board, comprising:
   a. a cut-clinch mechanism carried by the machine adapted to be located below the printed circuit board to cut and clinch the component leads to attach the component to the board;
   b. a fiber optics sensor associated with the cut-clinch mechanism and adapted to sense whether the component leads are in position prior to the operation of the cut-clinch mechanism;
   c. said sensor having filaments adapted to emit light against the component leads and filaments adapted to receive the light reflected from said component leads;
   d. said sensor filaments being positioned with respect to said board and said cut-clinch mechanism so that only the component leads will reflect the emitted light.

2. The automatic component inserting machine of claim 1 wherein said sensor filaments are located above the surface of the cut-clinch unit and emit and receive light substantially parallel to the board surface.

3. The automatic component inserting machine of claim 1 wherein the cut-clinch mechanism has spaced opposed cutting and clinching units and the fiber optics sensor is located in a housing between the cut-clinch units.

* * * * *